United States Patent [19]

Kohl et al.

[11] Patent Number: 4,883,427
[45] Date of Patent: Nov. 28, 1989

[54] APPARATUS FOR SUPPLYING VOLTAGE TO COMPONENT ASSEMBLIES

[75] Inventors: Gerhard Kohl, Frankenthal, Fed. Rep. of Germany; Mogens B. Christiansen, Lengnau, Switzerland

[73] Assignee: Asea Brown Boveri AG, Baden, Switzerland

[21] Appl. No.: 176,775

[22] Filed: Apr. 1, 1988

[30] Foreign Application Priority Data

Oct. 3, 1986 [DE] Fed. Rep. of Germany ....... 3633695

[51] Int. Cl.⁴ ........................ H01R 23/68; H05K 7/10
[52] U.S. Cl. ...................................... 439/64; 361/413
[58] Field of Search ..................... 439/59-62, 439/64, 101, 108; 361/412, 413, 415

[56] References Cited

U.S. PATENT DOCUMENTS 3,993,935 11/1976 Phillips et al. .
4,164,362 8/1979 Cobaugh et al. ...................... 439/64
4,333,696 6/1982 O'Neill et al. .
4,602,835 7/1986 Bauer et al. ......................... 439/108
4,717,344 1/1988 Schempp ............................. 439/61

FOREIGN PATENT DOCUMENTS 1140986 6/1963 Fed. Rep. of Germany .
3119249 11/1982 Fed. Rep. of Germany .
2850093 5/1986 Fed. Rep. of Germany .
2254927 7/1975 France .
2034126 5/1980 United Kingdom ................ 361/413
2157084 10/1985 United Kingdom .

Primary Examiner—Neil Abrams
Attorney, Agent, or Firm—Herbert L. Lerner; Laurence A. Greenberg

[57] ABSTRACT

A voltage supply apparatus includes a component assembly rack. A component assembly plugged into the component assembly rack has a first part subject to interference potential, a second part free of interference potential, and a contact strip for feeding process signals to the component assembly. Separate voltage supplies are provided for the parts. A front plug corresponds to the contact strip. A plug/socket system disposed between the component assembly and the component assembly rack establishes voltage supply to the first part when the component assembly is plugged into the component assembly rack.

4 Claims, 3 Drawing Sheets

APPARATUS FOR SUPPLYING VOLTAGE TO COMPONENT ASSEMBLIES

SPECIFICATION:

The invention relates to an apparatus for supplying voltage to component assemblies in component assembly racks having separate voltage feeds for a part of the component assembly which is free of interference potential and for a part of the component assembly which is subject to interference potential, and a front plug with a corresponding contact strip for feeding-in process signals.

In control technology, electronic components such as resistors, transistors and the like are combined on etched circuit boards to make component assemblies (plug-in boards, cards, parts, and standardized European format printed circuit cards). The plug-in component assemblies are mounted in a component assembly rack (tier), which has a wiring panel on the back thereof. A plurality of component assembly racks can be combined with other components, including non-electronic components in a control box or in a frame, in order to make a finished control system.

In electronic controls, the input and output of process signals from peripheral equipment (emitters and servo components) is often provided through front plugs on the front surface of the component assembly rack. Since a great number of component assembly racks with component assemblies inserted therein are present in the control boxes (frames), and the individual component assemblies must also be connected to one another, a great number of plugs, connections and connecting lines is necessary. For instance, a plug connection is also required between an inner part (shielded back panel on the component assembly rack) that is protected from interference potential and an outer region which is subject to interference potential. The outer region, which also includes the externally fed voltage supply, includes not only the plugs disposed on the front but also the input/output part of the component assembly and its connecting contacts.

The part which is protected from interference potential and which assumes the function of actual signal processing as well as cabling, is protected from interference by shielding hoods or shielding ducting (specialized cable ducts). For example, reference may be made to a Brown Boveri Corporation brochure GVK-TE 125/73, entitled: *Verkehrselektronik Steuerungs- und Regelungssysteme fr Fahrzeuge* [Open and Closed-Loop Electronic Traffic Control Systems for Vehicles], pp. 4–7. The voltage supply in the input/output equipment for the outer part which is subject to interference is provided through a front plug that can be plugged in from outside (that is, from the front). Each component assembly is supplied from the front through the front plug with the same process voltage. Therefore, when there is extensive circuitry, not only is the wiring quite costly, but there are also major problems of space with all the various hanging lines, because each component assembly is connected to the others at the front with cables.

It is accordingly an object of the invention to provide an apparatus for supplying voltage to component assemblies, which overcomes the hereinafore-mentioned disadvantages of the heretofore-known devices of this general type, which avoids feeding voltage at the front and which enables the voltage supply to the input/output equipment or to the component assembly to be established as soon as a component assembly is plugged into the component assembly rack.

With the foregoing and other objects in view there is provided, in accordance with the invention, a voltage supply apparatus, comprising a component assembly rack; a component assembly plugged into the component assembly rack having a first part subject to interference potential, a second part free of interference potential, and a contact strip for feeding process signals to the component assembly; separate voltage supplies for the parts; a front plug corresponding to the contact strip; and a plug/socket system disposed between the component assembly and the component assembly rack establishing voltage supply to the first part when the component assembly is plugged into the component assembly rack.

In accordance with another feature of the invention, there is provided another plug/socket system disposed between the component assembly and the component assembly rack, the plug/socket systems separately feeding process voltage and zero potential to the component assembly.

In accordance with a concomitant feature of the invention, the plug/socket system includes a plug mechanically disposed on the contact strip and a socket disposed on and insulated from the component assembly rack.

An advantageous feature of the apparatus according to the invention is, in particular, the simple feeding of voltage for the component assemblies disposed in the component assembly racks. The plugs located at the front and the corresponding contact strips on the component assemblies can be made smaller and simpler, because only predominantly process signals are carried by the plugs. An attractive appearance is attained by avoiding the previously typical mass of hanging cables at the front.

A considerable labor saving is attained because wiring of the sockets for feeding the voltage can be carried out in the factory when the component assembly rack is manufactured. Costly wiring work for the electronic control need no longer be provided by installers at the installation site, because the voltage supply is automatically established by plugging in the component assembly.

In modern electronic systems, voltages from the outer region (hardware region) should not be carried directly into the inner region (internal electronic region), and vice versa. Input/output equipment should therefore be provided for the signals, and for the supply voltages, power units having potential separation and shielding must be used. Since in the apparatus according to the invention the voltage supply or feeding takes place only in the relatively protected part of the component assembly rack, interference affecting the supply lines from outside can be better suppressed. The overall voltage supply can furthermore be constructed much more simply.

Other features which are considered as characteristic for the invention are set forth in the appended claims.

Although the invention is illustrated and described herein as embodied in an apparatus for supplying voltage to component assemblies, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
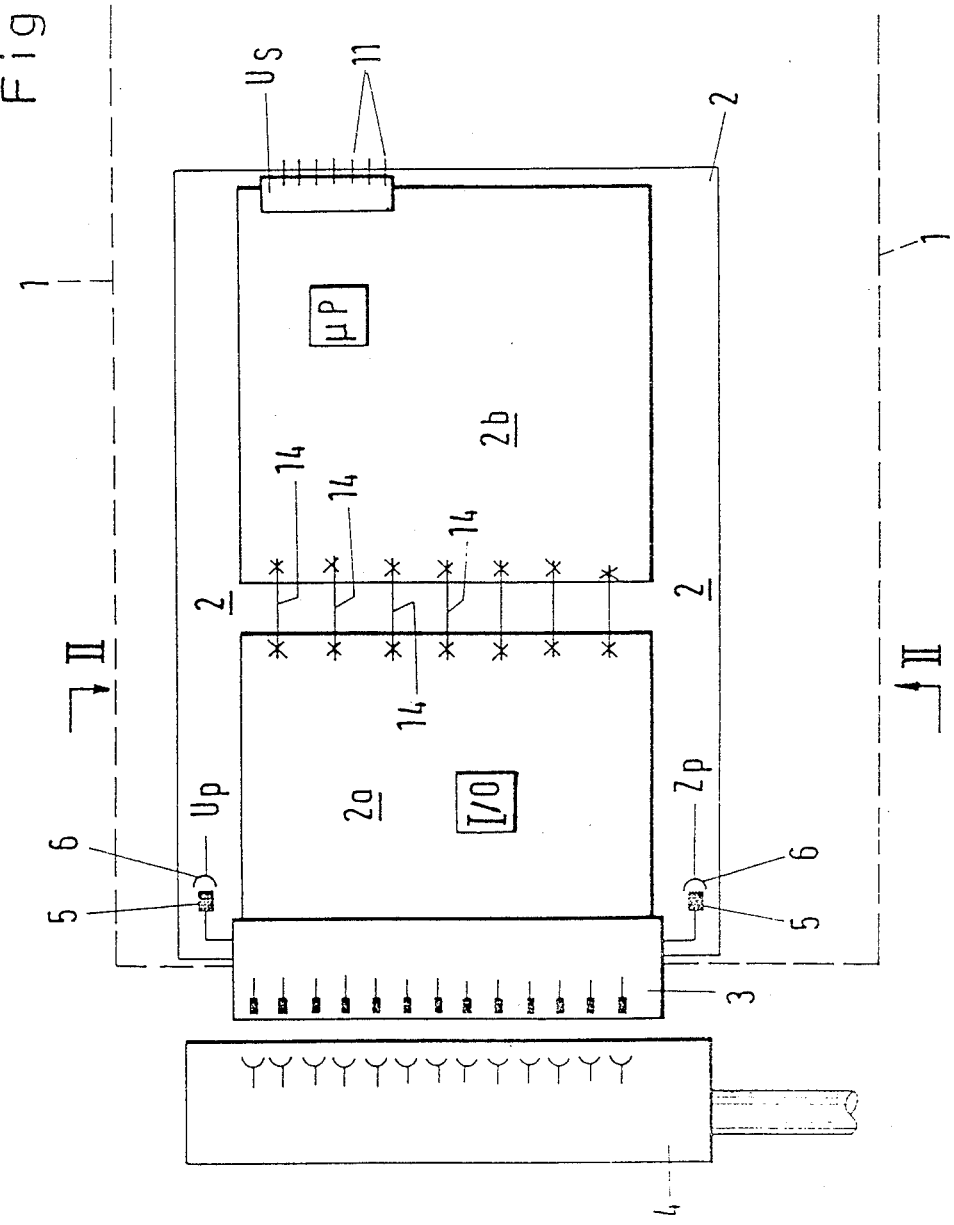
FIG. 1 is a fragmentary, diagrammatic and schematic elevational view of a section of a component assembly rack into which a component assembly has been plugged, with a front plug provided on the front or operating side for the feeding of process signals.

Referring now to the figures of the drawings in detail and first, particularly, to FIG. 1 thereof, there is seen one of a plurality of component assembly racks 1, which are disposed one alongside and/or above the other and are in a non-illustrated control box. Each component assembly rack 1 can receive a plurality of component assemblies 2 that can be plugged into the rack. The component assemblies 2 are supplied with different signal and operating voltages. A process voltage $U_P$ carried in the component assembly rack 1 is fed through a plug/socket system 5, 6 to the component assembly 2, while interference-protected voltages are located in shielded fashion inside the component assembly rack and are carried through contacts 11 at the back to the component assembly 2. The actual signal processing is performed, for example, with microprocessors $\mu P$ in a rear part 2b of the component assembly 2. At that location, an interference-free feed voltage $U_S$ is also needed and at that location bus lines to other component assemblies are picked up as well.

In FIG. 1, the component assembly 2 disposed in the component assembly rack 1 includes an unprotected front part 2a subject to interference and having input-/output equipment I/0 and the rear part 2b which is interference potential-free, protected and has the microprocessor or memory locations $\mu P$. The front part 2a of the component assembly 2 is connected to the rear part 2b by a plug connection 14. The component assembly 2 is introduced into the component assembly 1 in the conventional manner.

A contact strip 3 is disposed on the front of the front part 2a of the component assembly 2. A front plug 4 is inserted into the contacts of the contact strip 3. The front plug 4 carries external process signals of peripheral equipment (emitters and servo components) to the contact strip 3 for further processing, but also represents a possible means of connecting the component assemblies to one another. The supply of process voltage for the font part 2a of the component assembly 2 which is subject to interference, was previously provided through the front plug 4.

Figure 2:
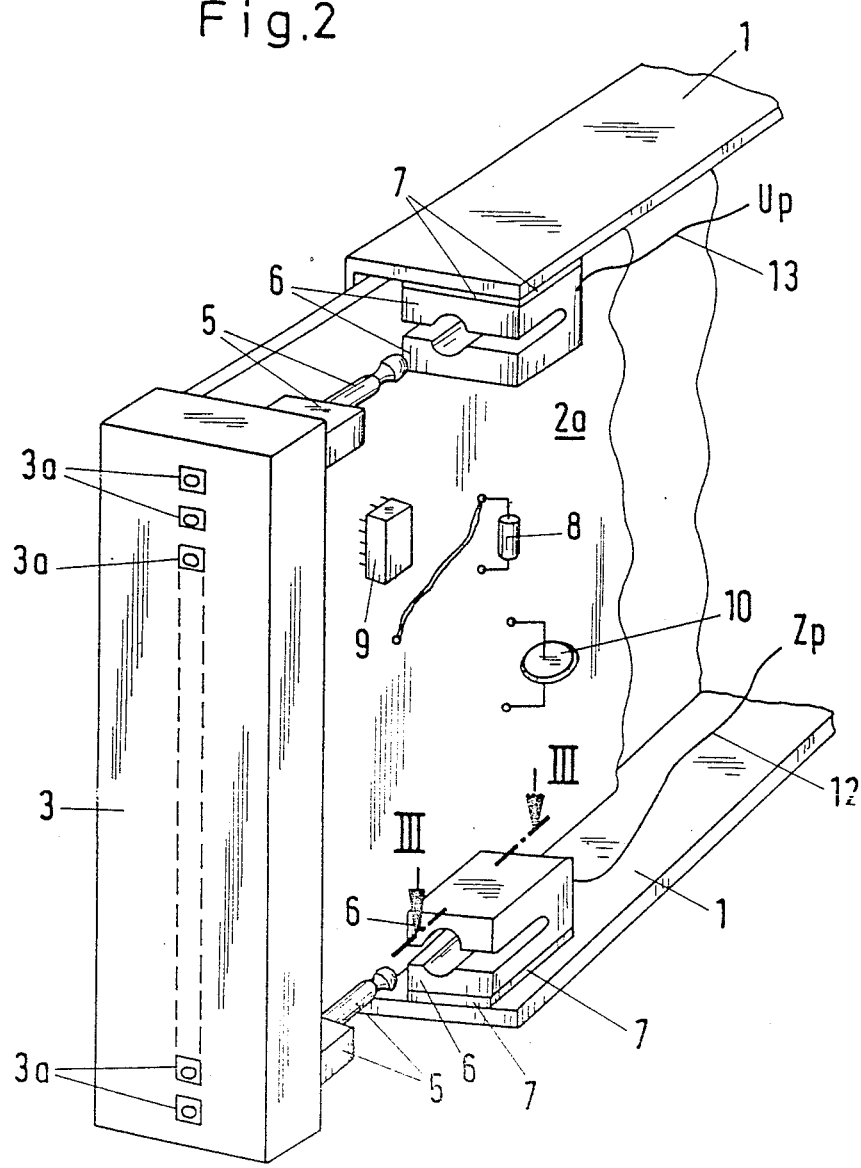
FIG. 2 is a fragmentary, perspective view of the apparatus according to FIG. 1 with the front plug omitted and with the component assembly rack and component assembly cut off approximately along the line II—II of FIG. 1, in the direction of the arrows.

In order to simplify the supply of feed voltage to the component assembly 2 and shift it into the part 2b of the component assembly rack that is less subject to interference, the plug/socket system 5, 6 is located in the upper and lower part of the component assembly in the vicinity of the contact strip 3, as shown in the drawing. The sockets 6 are disposed on the component assembly rack 1, while the plugs 5 are secured on the contact strip 3 of the component assembly 2, as best seen in FIG. 2. When the component assembly 2 is plugged into the component assembly rack 1, the supply with the process voltage $U_P$ takes place automatically. Costly wiring by installers which was previously required at the installation site, can thus be dispensed with entirely because the plug/socket system for feeding voltage has already been mounted in the factory. The expense for shielding the component assembly is also considerably reduced by supplying the component assembly from a voltage level inside the control box, into which only a small amount of interference can penetrate from outside. A clear separation is thus formed between the electromagnetically clean part 2b of the component assembly 2 which has its own voltage supply (feed voltage $U_S$) at the back and the part 2a which is subject to interference and has a voltage supply (process voltage $U_P$) provided by means of the plug/socket system according to the invention. If an operating voltage for a system to be connected from the outside is required at the front plug 4 which only carries process signals, the voltage can be drawn through the contact strip 3 from the novel plug/socket system 5, 6.

The novel plug/socket system 5, 6 is shown in the highly schematic and diagrammatic drawing of FIG. 1. The plug contact 5 is disposed mechanically and electrically on the contact strip 3 of the component assembly 2, while the resiliently constructed socket 6 is attached to the component assembly rack 1 in a firm but insulated manner. The plug contact 5 is secured to but located spatially outside the contact strip 3. Both the plug contact 5 and the socket 6 may be insulated, making the system 5,6 contact-voltage proof.

The plug/socket system 5, 6 is provided twice and advantageously on the upper and lower portion of the contact strip 3 for an unequivocal feeding of potential. The upper plug/socket system is provided for supplying the positive process voltage $U_P$ and the lower plug/socket system is provided for supplying a negative potential $Z_P$ (0 bus). Sockets 6 are present over the entire width of the component assembly rack 1, so that further component assemblies can be plugged in as needed.

According to FIG. 2, the front part 2a of the component assembly 2, which is subject to interference potential, has the contact strip 3. Contacts 3a of the contact strip are only diagrammatically illustrated in the drawing. The front plug 4 of FIG. 1 is plugged into the contacts 3a of the contact strip 3.

The component assembly 2 including the two parts 2a and 2b and the contact strip 3, is introduced into the component assembly rack 1 in the usual manner. In FIG. 2, the rear portion 2b of the component assembly 2 is not shown. Sockets 6 are secured on the component assembly rack 1 at the top and bottom. The sockets 6 are insulated from the component assembly rack 1 by insulating disks 7. The positive process voltage $U_P$ is carried to the upper socket 6, and the negative potential $Z_P$ is carried to the lower socket 6. Electric feed lines 12 and 13 lead to the sockets 6.

Plug contacts 5 are provided on both the upper and lower part of the contact strip 3. However, the plug contacts may also be contact blades, which are secured on the front part 2a of the component assembly 2 and then engage suitably shaped receiving sockets.

When the component assembly 2 is introduced into the component assembly rack 1, the plug contacts 5 engage the sockets 6 and make a low-resistance electrical connection, so that components 8, 9, 10 on the front part 2a of the component assembly 2 which is subject to interference potential, are supplied with voltage. Naturally, a reversal of the plug/socket system can also be made, in which case a socket on the component assembly makes contact with a plug on the component assembly rack.

Figure 3:
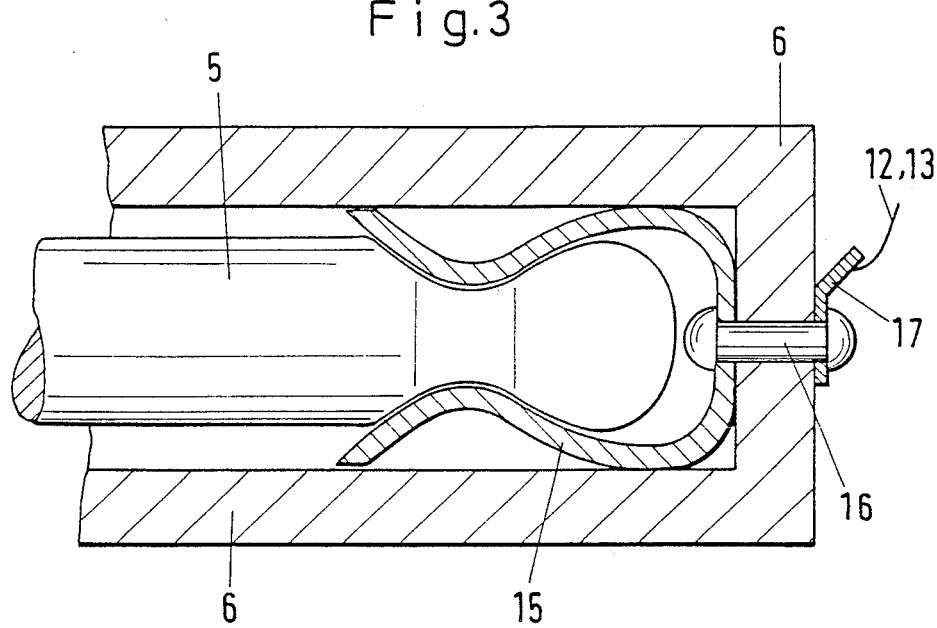
FIG. 3 is a fragmentary, longitudinal-sectional view of the plug/socket system of FIG. 2 taken along the line III—III in FIG. 2, in the direction of the arrows.

FIG. 3 shows a longitudinal section of an embodiment of the plug/socket system 5, 6. The socket 6 is sectioned along the line III—III of FIG. 2, and the plug 5 is shown in its plugged-in condition. The plug 5 is retained inside the socket 6 by a spring contact 15. The spring contact 15 is secured by a rivet 16 on the back wall of the socket 6. The lines 12, 13 for the respective voltage supply $U_P$ and $Z_P$ are connected to a connecting contact 17 on the rivet 16 on the outside of the socket 6.

Figure 4:
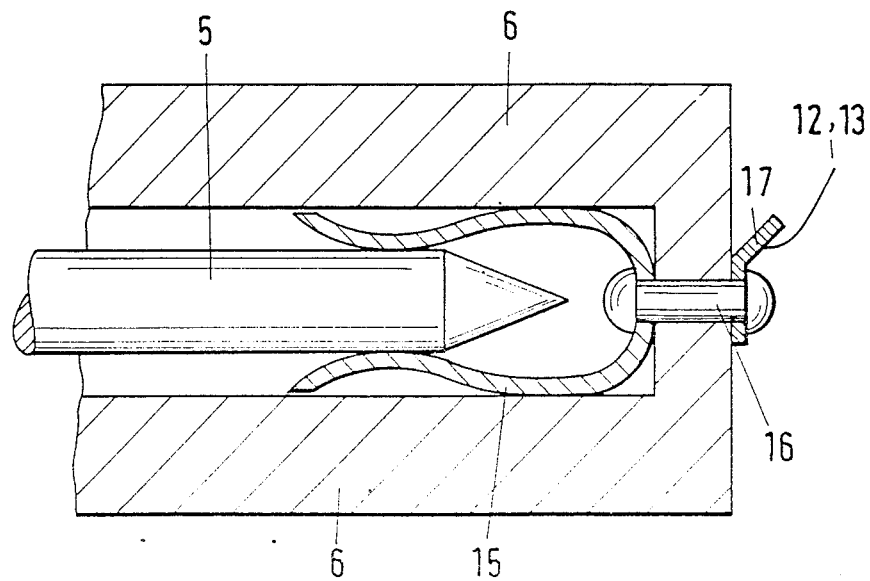
FIG. 4 is a view similar to FIG. 3 of a modified embodiment of the plug/socket system thereof.

FIG. 4 shows an embodiment which is modified as compared to that of FIG. 3. In FIG. 4, the plug 5 is constructed as a contact blade, which is introduced into the spring contact 15 of the socket 6. Identical reference numerals are used for elements identical to those of FIG. 3.

In closing, it should also be pointed out again that the apparatus according to the invention is in no way restricted to the plugs and associated sockets shown in FIGS. 2-4, but instead can include spring contacts, fork contacts and the like. For instance, a pin pressed into the component assembly can make an electrical connection with a spring or blade contact when the component assembly is introduced into the component assembly rack. Contact can also be made between the printed edge contacts (that is, those provided with conductive copper tracks) on the component assembly and a spring contact on the component assembly rack.

We claim:

1. Voltage supply apparatus, comprising a component assembly rack having a top and a bottom; a plurality of component assemblies to be plugged into said component assembly rack, each of said component assemblies having a front part subject to interference potential, a rear part free of interference potential, and a contact strip mechanically rigidly connected to said front part of said component assembly for feeding process signals to said component assembly, said contact strip having upper and lower parts; separate voltage supplies for said front and rear parts of said component assembly; a front plug to be connected to said contact strip for supplying external process signals; a pair of plugs each being disposed at a respective one of said upper and lower parts of said contact strip in the vicinity of said front part of said component assembly, components disposed on said front part of said component assembly and electrically connected to said plugs, and electrically insulated sockets each being disposed at a respective one of said top and said bottom of said component assembly rack, said plugs and said sockets being in electrical contact when said component assembly is plugged into said component assembly rack.

2. Apparatus according to claim 1, including electric supply lines supplying said socket disposed at said top of said component rack with a process voltage and supplying said socket disposed at said bottom of said component assembly rack with a negative potential.

3. Apparatus according to claim 1, where in said plugs are attached to and insulated from to said component assembly.

4. Apparatus according to claim 1, wherein said sockets have spring contacts, and said plugs are contact strips to be inserted into said spring contacts.

* * * * *